(12) United States Patent
Xu et al.

(10) Patent No.: US 8,907,710 B2
(45) Date of Patent: Dec. 9, 2014

(54) DIGITALLY CONTROLLED DELAY DEVICE

(71) Applicant: Broadcom Corporation, Irvine, CA (US)

(72) Inventors: Liangge Xu, Espoo (FI); Kari Stadius, Helsinki (FI); Jussi Ryynanen, Vantaa (FI)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/082,688

(22) Filed: Nov. 18, 2013

(65) Prior Publication Data

US 2014/0077858 A1    Mar. 20, 2014

Related U.S. Application Data

(63) Continuation of application No. PCT/IB2012/052509, filed on May 18, 2012.

(51) Int. Cl.
    *H03H 11/26*    (2006.01)

(52) U.S. Cl.
    USPC ............ 327/266; 327/270; 327/272; 327/276

(58) Field of Classification Search
    USPC .................................. 327/266, 269–272, 276
    See application file for complete search history.

(56) References Cited

U.S. PATENT DOCUMENTS 5,448,159 A    9/1995  Kojima et al.
6,020,730 A *  2/2000  Jurek et al. ..................... 323/312

FOREIGN PATENT DOCUMENTS

| CN | 101488737 A | 7/2009 |
| FR | 2681992 A | 4/1993 |
| JP | 2008/182334 A2 | 8/2008 |

OTHER PUBLICATIONS

Maymandi-Nejad et al., "A Monotonic Digitally Goritolled Delay Element" IEEE Journal of Solid-State Circuits vol. 40, No. 11, Nov. 2005, pp. 2212-2219.
Maymandi-Nejad et al., "A Digitally Programmable Delay Element Design and Analysis" IEEE Transactions on Very Large Scale Integration (VLSI) Systems, vol. 11, No, 5, Oct. 2003, pp. 871-878.
Finnish Search Report dated May 2, 2012, which was issued in a related Finnish Patent Application No. 20115481 (2 pages).
PCT International Search Report dated Aug. 3, 2012, which was issued in a related PCT International Application No. PCT/IB2012/052509 (4 pages).
PCT International Preliminary Report on Patentability Mar. 11, 2013 issued in a related PCT International Application No. PCT/IB2012/052509 (6 pages).

* cited by examiner

*Primary Examiner* — Kenneth B. Wells
(74) *Attorney, Agent, or Firm* — Foley & Lardner LLP

(57) ABSTRACT

A digitally controlled delay device includes at least one delay generating gate device, whose propagation delay is controlled by limiting operating current by means of a tail transistor that is controlled by its gate voltage, a gate control voltage control means for controlling the current limiting transistor gate voltage, and a bank of digitally controlled MOSFET transistors in parallel configuration, and the digital control is adapted to switch the transistors to off and to diode mode connection, current feeding means to feed current through the bank of MOSFET transistors, and the voltage over the bank of parallel transistors is used for gate source control voltage of the tail transistors.

8 Claims, 2 Drawing Sheets

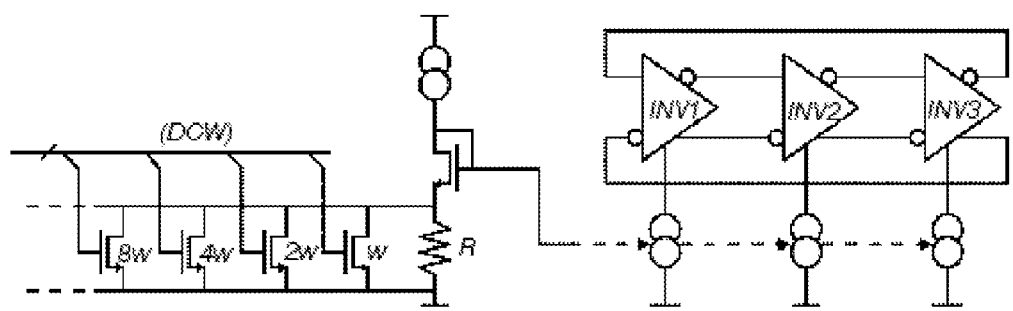
Prior Art *Fig. 1*
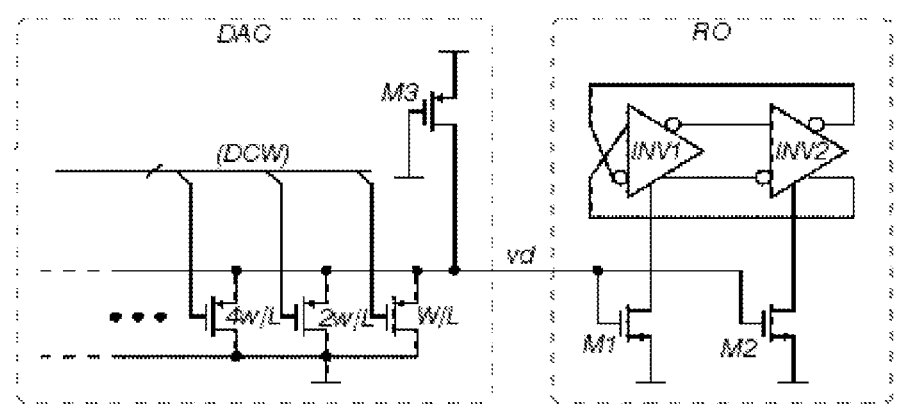
*Fig. 2*

US 8,907,710 B2

DIGITALLY CONTROLLED DELAY DEVICE

CROSS REFERENCE TO RELATED APPLICATIONS

This application is a Continuation of PCT International Patent Application No. PCT/IB2012/052509 filed on May 18, 2012, which claims the benefit under 35 U.S.C §119(a) and 37 CFR §1.55 to Finnish patent application No. 20115481, filed on May 18, 2011 the entire disclosure of each of which is incorporated herein by reference.

FIELD OF THE INVENTION

The invention relates to a silicon area digitally controllable delay and a method of producing a linear digital delay control.

BACKGROUND INFORMATION

The known delay control device of FIG. 1 uses DAC (Digital to Analog Converter), and controllable current sinks for adjusting the maximum current of each inverter in the ring oscillator. The current is used to control the speed of charging and discharging of the capacitors in the inverter. The delay is approximately linear function of the invert of maximum current I defined by the current sources. This is described in document by V. De Heyn, G. Van der Plas, J. Ryckaert, J. Craninckx, "A fast start-up 3 GHz-10 GHz digitally controlled oscillator for UWB impulse radio in 90 nm CMOS," in Proc. European Solid State Circuits Conference, pp. 484-487, 11-13 Sep. 2007.

The device of FIG. 1 is a prior art device, that is based on a constant current source, a diode mode transistor and a bank of transistors acting as adjustable resistor for tuning the bias of the current mirrors of the delay devices. The diode connected transistor is generating approximately constant voltage drop that is summed with the bank of transistors and resistor R voltage. The diode mode transistor is ensuring the current mirrors staying in active region and keeping the current at least to a minimum value that is defined by the constant current source, sizes of transistors and the minimum voltage drop over the transistor bank and the resistor.

The problem is that the minimum mirrored current is quite high, and therefore the usable maximal delay is short.

Another well known way is to use current mirror and controllable current source for controlling the delay devices load capacitance discharge current. For all digital circuit there is not enough operating voltage headroom for properly working analogue elements to generate both digitally controlled current and a current mirror.

The other well known way to control the delay is to control the load capacitance of the inverters. Load capacitance control limits the minimum delay considerably compared to delay device current limiting control, because adding load capacitance always slows down the delay device, and the capacitance is not possible to control to zero.

SUMMARY

An object of invention is to provide more compact and less power hungry device with yet good linearity of control over large delay area, and further to provide good compatibility with digital CMOS design. Delay circuits are needed for PLL, especially for All Digital PLL (ADPLL) ring oscillator, and also in delay-locked loops and delay-tuneable time-to-digital converters (TDCs).

This object of invention is achieved by using the controllable transistor bank as controllable current mirror with varying mirroring ratio. This is done by using a diode mode transistor as current mirror input transistor gate connected to power supply rail when the transistor is turned on. This allows fast and simple control, and still the transistor voltage drop is equal to gate-source-voltage. The gate is connected to power supply rail voltage simply by any CMOS gate output, and it is turned off by the same logic gate.

The invention uses therefore a current mirror that the gates of input and output are not in the same voltage, but the input transistors are opposite polarity and their gates are switched to the rail voltage.

BRIEF DESCRIPTION OF THE DRAWINGS

The invention is described in detail with reference to figures.

FIG. 1 presents a state of art schematic.
FIG. 2 presents an embodiment according to the invention used to control the delay of a ring oscillator.

DETAILED DESCRIPTION

Figure 3:
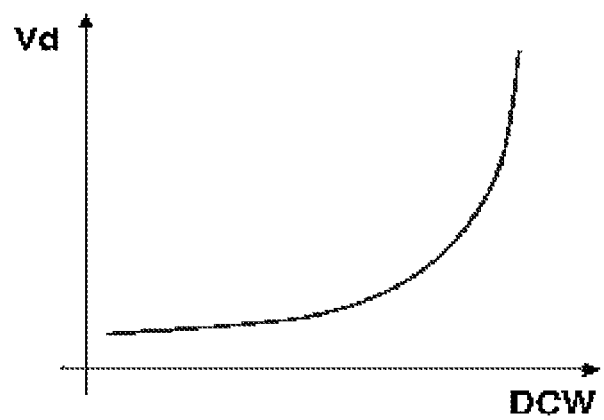
FIG. 3 presents digital to voltage relationship for Vd in FIG. 2.

FIG. 1 shows the prior art solution discussed above. This approach allows a smaller minimum delay than tuneable capacitors. However, the control cannot turn the current mirror transistors of the delay cells to very low maximum current, because the control voltage is always higher than the diode mode transistors voltage drop. If the current source is very small and the diode connected transistor very wide, the device control speed is limited, as the small current of the current mirror control circuit cannot drive the gate capacitances of the current mirrors that control the delay circuits maximum current. Implementation of constant current sources is also becoming more problematic for its ill-compatibility with nowadays nanoscale CMOS due to the increased leakage current and channel length modulation of MOS transistors.

FIG. 2 presents a simplified schematic of an embodiment of the invention in form of a digitally controlled ring oscillator as delay device. The invention can be used to control also other delay devices, not only ring oscillator.

In following description the current mirror output transistors are called tail transistors of the delay device. They may work as current mirrors, when the control voltage is small, and the gate-drain voltage is large during the state change of the delay device. For large control voltages they work most current conducting time in triode mode, and the delay control of very small delay values is working as triode mode resistance control.

The overall exact analysis of the device is not straight forward for typical CMOS-process, as the transistors are far from ideal analogue electronics devices. The fine tuning of the device properties must be therefore done by simulation and testing.

The first part of the FIG. 2 device is Non-linear Digital to Analogue Converter (DAC), or a current mirror, that changes its current and current mirroring ratio as function of the digital control. The DAC takes as its input a Digital Control Word DCW, and its output is voltage Vd. Voltage Vd is used to control the ring oscillator RO current limiting tail transistors M1 and M2 that are used for limiting the inverter INV1 and INV2 operating current The M1 and M2 are of opposite polarity than the DAC transistors, therefore it is not a conventional current mirror configuration, as the gates of input and output are not in any way connected to each other.

The DAC in FIG. 2 is a simple voltage divider that gives a non-linear voltage output Vd. The upper resistance transistor M3 is a small PMOS transistor with moderately high on-resistance. As can be seen from the FIG. 2, the upper PMOS M3 is normally turned on, as the gate of it is connected to 0 volts. There may be also a control to turn the transistor M3 and the whole device off. M3 is typically longer than wide.

The lower transistors are digitally weighted PMOS transistors and their channels are connected parallel to form the lower branch of the voltage divider. They are controlled by a digital control word signal referred in FIG. 2 by DCW. They are turned off by logic "1" or high operating voltage to their gate, and turned on by logic "0". When they are turned on, they work in diode mode. When all the transistors are on, the output is still not pulled lower than threshold voltage of the transistors.

When all transistors are on, the voltage over them is at its minimum, and so is the total current. The current mirroring ratio is in that case lowered more than the current is increased, if the current mirror analogue is used for analysis. The other way is to simply consider the bank of transistors as width variable diode connected FET, with transistor M3 as a pull up resistor. It is in clear triode mode when the output voltage of DAC is high, and it is close to active region or in active region when the diode connected transistor bank is all on, and the voltage over them is about the threshold voltage.

This use of diode mode transistors in the DAC voltage control allows surprisingly easy way to implement linear control of delay and fast reaction time for the control. Also it allows longer delays than the FIG. 1 solution, as the control voltage can be nearly the threshold voltage. This arrangement is advantageous because PMOS transistors usually have bit higher threshold voltage than NMOS, and the minimum control voltage of NMOS tail transistor is therefore always bit over threshold. The DAC both branches are of same polarity, and therefore the properties of DAC is stable for process variations.

Also due to the structure of the DAC, the transistor bank W/L ratio function is easy to make monotonous as function of digital control word, and also the voltage function is therefore monotonous, if the bank transistors have alike properties.

The weighted transistor may also advantageously be arranged so, that there is a coarse adjustment and fine tuning. This can be made with two parallel banks of transistors. The coarse adjustment bank has minimum step of the channel W/L ratio that it smaller than the second bank tuning range. Fine tuning may also be made by a thermometer coded bank of equal size transistors.

The approximate digital to voltage Vd/DCW function is presented in FIG. 3. The Vd slope in lower DCW values is small, and the tail transistors are working in high resistance state, with lower gate-source voltage and higher drain-source voltage during the current limiting of the inverter. This leads the tail transistors working with low DCW values close to threshold in active region, therefore limiting the maximum current during the state change of the delay device.

Figure 4:
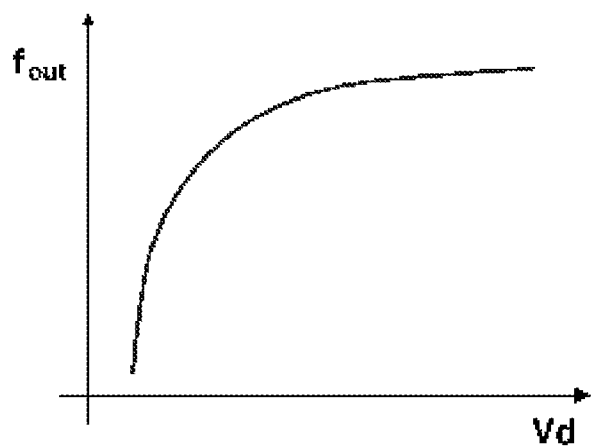
FIG. 4 presents voltage Vd to frequency relation.

Raising the Vd voltage lowers the voltage over tail transistors and the current raises and the tail transistors start to operate more of the their current conducting time in triode region. The tail transistor current changes during the state change of the delay device. The voltage-to frequency or voltage to delay function is steep in the small control voltages Vd close to the threshold voltage of tail transistors, as depicted in FIG. 4.

Figure 5:
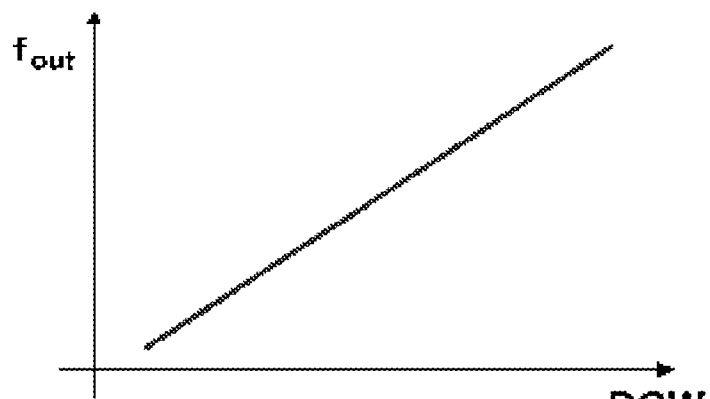
FIG. 5 presents approximate digital to frequency relationship of the FIG. 2 device.

It is demonstrated by the above that nonlinearities of the above two relationships can cancel each other out almost perfectly when cascaded, and result in a very linear overall linear relationship between the DCW and output delay, as illustrated in FIG. 5.

The overall mathematical analysis of the digital to delay or frequency response is difficult, and it is advisable to use simulation to find the right values for the transistor size ratios with different processes and parameters. The weighted transistors may be calculated as digitally controlled variable width single transistor, which is then split to weighted width transistors as needed. In practice the tail transistor voltage to delay function is first determined, and its inverse function is defined. After that the digital to voltage function is defined as needed. The tail transistor preferably controls the inverter (or other gate) entire current, the tail transistor may be simply connected in series with the other CMOS-inverter transistor. The tail transistor is usually simply in series with the transistors of the inverter. It may be easier to use buffers instead of series inverters, so that only every second inverter stage is affected by the tail transistor. The delay device may be made on purpose slower by adding some load capacitance.

The tests of the device according to the invention showed nearly linear behaviour, and the dimensioning of the transistors was not very difficult, the compensation of non-linearity worked with different designs requiring only moderate work with simulator optimization and the production stage prototypes are also working with good linearity and repeatability.

The device may of FIG. 2 may be understood as a complementary polarity current mirror with changing mirroring ratio. Larger input current leads to smaller output current, as the current mirroring ratio is increasing more than the input current. It may be also considered to be a voltage division circuit with diode mode FET bank as lower branch and a high resistance FET as upper branch.

Instead of the complementary polarity current mirror, the bank transistors have same polarity with the tail transistors. The bank transistors should be then controlled by complementary parallel FET-switches for connecting the gate to diode mode and other switch transistor for each bank transistor to turn the transistor off by grounding the gate. The operation voltages and Vd also changes, as the threshold voltage of NMOS is usually bit lower, the smallest control voltage would be smaller and the tail transistors may not operate properly for lowest control voltages. Further, the NMOS lower resistances would require more current or longer transistor channels, therefore taking more silicon area than same resistance PMOS transistors. Also the operation speed would be worse, as the control voltages of the bank transistors are not rail to rail as with the complementary polarity PMOS transistors. The advantage may be that the same polarity input and output in the current mirror circuit is not as sensitive to processing variations.

The minimum delay is smaller than in prior art solutions when implemented inside a digital CMOS integrated circuit with low operating voltage with either tuneable capacitances. Compared to normal current mirror the controllable range is easy to make larger, because the maximum tail transistor control current is defined by the current mirroring ratio of tail transistor divided by the smallest bank transistor. The longest delay is defined by the on-voltage of Whole bank turned on and the pull-up transistor limiting the current. The digital control was moderately easy to implement with simulator optimisation resulting to good enough linearity for all digital PLL or most other uses for tuneable digital delay.

The linearity of the device is surprisingly good, even many of the transistors are not working in any clearly defined operation mode and the overall behaviour is hard to analyse for different delay values. The varying operation conditions and different operation modes as function of the control word are true not only for the tail transistors, but also for the pull up transistor, and the delay device transistors that are current limited by tail transistors. The operation is linear over much larger control range than was expectable.

The invention claimed is:

1. A digitally controlled delay device, comprising:
   a delay generating device, wherein a propagation delay of the delay generating device is controlled by limiting an operating current of the delay generating device, wherein the operating current is limited by a tail transistor controlled by its gate voltage;
   a controller for controlling the gate voltage of the tail transistor, the controller including:
     a bank of digitally controlled MOSFET transistors having a common drain connection and a common source connection, each of the digitally controlled MOSFET transistors in the bank having a first polarity, and the tail transistor having a second polarity opposite the first polarity;
     wherein each of the MOSFET transistors in the bank is configured to be individually selectively controlled;
     wherein each of the MOSFET transistors in the bank is configured to be controlled in diode mode by driving a voltage on the gate of each of the MOSFET transistors to either of two power supply rail voltages;
     wherein the controller is configured to
       apply a common gate-source voltage to each selected digitally controlled MOSFET transistor in the bank causing a first current to flow through the bank, establishing a resulting voltage at the common source connection of the bank; and
       apply the resulting voltage as the gate voltage of the tail transistor causing a second current to flow through the tail transistor, so that the ratio of the second current to the first current is defined by the selected digitally controlled MOSFET transistors in the bank operating in diode mode; and
     a digital control adapted to selectively switch each of the digitally controlled MOSFET transistors of the bank to off or to diode mode.

2. The digitally controlled delay device of claim 1, wherein the first current is fed from an on-turned FET transistor.

3. The digitally controlled delay device according to claim 2, wherein the first current is fed through an active mode FET transistor acting as constant current source.

4. The digitally controlled delay device according to claim 2, wherein the first current is fed through a triode mode FET transistor acting as resistor.

5. The device according to claim 1, wherein the delay generating device is part of ring oscillator, delay-locked loop, or delay-tuneable time-to-digital converter (TDC).

6. The device according to claim 1, where in the digitally controlled delay device is part of a CMOS integrated digital circuit.

7. The device according to claim 6, wherein the CMOS integrated digital circuit comprises the power supply rail.

8. An apparatus, comprising:
   a voltage control device, including
     a plurality of transistors having a common source connection coupled to a provider of variable current, and a common drain connection coupled to a reference voltage; and
     a plurality of inputs, each input configured to receive a voltage for application to a gate of a respective one of the plurality of transistors;
   a delay device including a tail transistor and a delay component, wherein the common source connection of the voltage control device is coupled to a gate of the tail transistor, and the delay component is coupled to the drain of the tail transistor;
   wherein the voltage control device and delay device are configured for a common voltage applied to selected ones of the plurality of inputs to cause a first current through the plurality of transistors, wherein a corresponding voltage developed at the common source connection controls a second current through the tail transistor, and the ratio of the second current to the first current is a function of a diode mode of each of the plurality of transistors corresponding to the selected ones of the plurality of inputs.

* * * * *